United States Patent [19]
Heckman et al.

[11] Patent Number: 5,812,617
[45] Date of Patent: Sep. 22, 1998

[54] SYNCHRONIZATION AND BATTERY SAVING TECHNIQUE

[75] Inventors: John Benjamin Heckman, Nepean; Gyles Panther, Goulbourn, both of Canada

[73] Assignee: Silcom Research Limited, Canada

[21] Appl. No.: 365,505

[22] Filed: Dec. 28, 1994

[51] Int. Cl.⁶ .................................................. H04L 7/00
[52] U.S. Cl. .................. 375/362; 340/825.44; 455/38.3; 375/376
[58] Field of Search ..................................... 375/362, 354, 375/365, 366, 368, 373, 376, 364; 370/100.1, 105.4, 105.5, 105.6; 340/825.44, 311.1; 455/38.3, 343

[56] References Cited

U.S. PATENT DOCUMENTS 4,652,875  3/1987  Waki .................................. 340/825.44
5,077,758 12/1991  DeLucia et al. .......................... 375/95
5,111,486  5/1992  Oliboni et al. .......................... 375/120
5,331,292  7/1994  Worden et al. .......................... 331/1 A

*Primary Examiner*—Tesfaldet Bocure
*Assistant Examiner*—Bryan Webster
*Attorney, Agent, or Firm*—Hayes, Soloway, Hennessey, Grossman & Hage, P.C.

[57] ABSTRACT

A synchronization apparatus in a selective call receiver comprised of a digital variable bandwidth phase locked loop with means to simultaneously detect the synchronization code word, means to generate a binary code from a register representative of lock quality, means to increment or decrement the lock quality register, means to sum the lock quality binary code into a phase error register, whereby the polarity of the sum is controlled by a phase comparison of the a local clock with the received data, and whereby the under or over flow of the phase error register determines the direction of a phase adjustment to the local bit clock generator.

4 Claims, 4 Drawing Sheets

SYNCHRONIZATION AND BATTERY SAVING TECHNIQUE

The present invention relates generally to selective call radio receivers and particularly to a means to achieve synchronization while minimizing the consumption of battery power.

BACKGROUND OF THE INVENTION

In current art selective receivers, the power consumption required to operate the radio receiver section of the device represents the larger part of the total power consumed. It has therefore become the practice to design such selective receivers so as to operate the receiver section in a duty cycled manner, both when searching for a transmitted paging signal and when actively receiving transmitted paging signals. Accordingly paging protocols currently in wide use include provision for power saving by reduction of the receiver duty cycle, so as to minimize the receiver ON time.

One such widely used paging protocol is the CCIR radio paging code no 1, otherwise known as POCSAG (Post Office Standards Advisory Group). POCSAG paging signals are digital signals modulated by direct FSK on a single frequency Radio Frequency carrier signal. The base band POCSAG signal, illustrated in FIGS. 1 and 2, is comprised of a pre-amble sequence of 576 bits of alternating 1's and 0's, followed by an indefinite number of batches, each batch in turn consisting of a reserved synchronization code word, followed by 8 frames, each of two 32-bit codewords.

A population of selective receivers tuned to a single RF carrier frequency is subdivided into 8 groups, with each group corresponding to one of the 8 frames described above. Each pager within the population is uniquely addressed by a 21 bit address, of which 3 bits are an index into one of the 8 said frames.

An address code word consists of 32 bits comprised of a one bit message flag bit (set to 0 for an address codeword), an 18 bit address, 2 function code bits, 10 BCH parity bits for error detection and correction, and a single even parity flag. A message may be conveyed to a specific pager by message code words which are appended immediately following the unique address. Each message codeword consists of a message flag (set to 1 for a message codeword) followed by 20 bits of message data, 10 bits of BCH parity bits for error detection and correction, and a single even parity bit. The POCSAG protocol defines two formats for packing data into the 20 bits of each message codeword. The first is a numeric format, in which digits are packed in Binary Coded Decimal (BCD), and the second is an alphanumeric format in which standard ASCII characters are packed as 7 bits per character. An indefinite number of message codewords may be append to an address, such codewords displacing address opportunities for addresses associated with overwritten frames.

A block diagram of a typical superheterodyne receiver is shown in FIG. 2. Following the conventional processing steps of frequency conversion and signal selection and amplification in mixers, filters and amplifiers, the received FSK signal is demodulated to recover the POCSAG base band signal. Typically this is an audio signal which is then further filtered in a data filter to limit its bandwidth, so as to improve the signal to noise ratio for the wanted signal, before a digital signal is extracted by means of a comparator with one or more comparison levels.

In order to improve the sensitivity of such receivers it is the common practice to minimize the bandwidth of the received analog signal (10) prior to extraction of the digital signal (20). In the absence of a received signal (i.e. a quiescent channel) the output from the demodulator (10) is electrical noise which, after filtering has a similar spectral content to that of the wanted signal. In order to extract information from a received digital signal it is necessary to determine the bit timing boundaries in the received signal, a process known as bit synchronization. In order to reduce the receiver ON time in the absence of a received signal it is highly desirable to quickly discriminate between noise and data, but this requires a highly discriminating means because of the spectral similarity. Inability to discriminate can also lead to false synchronization (on noise), which can result in missed messages in certain circumstances.

A novel synchronization and battery saving algorithm is proposed to resolve the difficulties with the present systems.

SUMMARY OF THE INVENTION

Selective receivers are called upon to operate correctly in response to signals which are formally compliant with the POCSAG standard but differ in other unspecified particulars.

In some paging systems, groups of POCSAG batches may be concatenated such that preamble immediately follows the termination of the previous batch and the sequential transmissions may not be coherent with respect to bit timing. Synchronization algorithms of prior art pagers have provided for a time-out if the synchronization codeword is not detected within a predetermined period. The proposed synchronization algorithm provides for an immediate bit and batch re-synchronization on the event of a synchronization termination due to any cause. This provides for capturing of concatenated POCSAG batches regardless of the bit timing coherence between the sequential transmission sequences.

In the event that a true pre-amble transmission commences shortly after a target receiver incorrectly acquires false synchronization with respect to a leader transmission or noise which is nearly coherent with the transmitted signal, a substantial and variable delay may occur before sufficient errors are accumulated to cause rejection of the current synchronization timing in conjunction with the incoming pre-amble. In the event that bit synchronization is lost while batch synchronization is being sought, the proposed synchronization method provides for a shortened sleep time before the next bit sync attempt, thus greatly reducing the probability of missed pages due to sleep periods which extend to and beyond the following sync code word in the case of a previous false synchronization.

In previous art pagers, it has been necessary to achieve bit synchronization prior to acquisition of batch synchronization. Because the proposed variable bandwidth bit synchronization hardware is semi-autonomous and provides for very rapid bit synchronization, it is possible to detect the sync codeword simultaneously with acquisition of bit sync.

After acquisition of bit and batch synchronization, the continued evaluation of subsequent synchronization codewords, being the first word in each batch, is redundant, provided bit synchronization is maintained. Prior art systems monitor all synchronization code word transmissions, or evaluate the first sync code word in a sequence of batches but require a transmission break to reset the single codeword evaluation circuit.

The difficulties described above are overcome and resolved with the methods and described below.

A synchronization apparatus in a selective call receiver comprised of a digital variable bandwidth phase locked loop with means to generate a binary code in a register representative of lock quality, means to increment or decrement the lock quality register, means to sum the lock quality binary code into a phase error register, whereby the polarity of the sum is controlled by a phase comparison of the a local clock with the received data, and whereby the under or over flow of the phase error register determines the direction of a phase adjustment to the local bit clock generator.

A synchronization method in a selective call receiver comprised of a radio receiver, microcontroller, and a digital phase locked loop, whereby synchronization of the local bit clock with a received data stream is achieved by the steps of periodically enabling the radio receiver to receive and demodulate a wanted RF signal for a first sampling period with a sampling interval of a first time period, generating a received data transition signal from the receiver output such that each transition of a selected direction in a received digital signal is represented by single pulse, enabling a digital phase locked loop simultaneously with the enabled period of the radio receiver so as to potentially acquire bit synchronization with the said received data transition signal, if received, extending the enable time for the radio and digital phase locked loop for a second time period if the digital phase locked loop becomes locked to the received data transition signal, simultaneously searching for a pre-determined synchronization code word for the duration of the radio enable time, repeating the steps of extending the radio enable time and simultaneously searching for sync code word if the digital phase locked loop becomes locked but no sync code word is detected, and enabling the radio receiver and phase locked loop after a third time period, said third time period being shorter than said first time period, if the digital phase locked loop fails to remain locked after having initially becoming locked in any immediately preceding period.

A synchronization method in a selective call receiver comprised of a radio receiver, microcontroller, and a digital phase locked loop, whereby synchronization of the local bit clock with a received data stream is achieved by the steps of periodically enabling the radio receiver to receive and demodulate a wanted RF signal for a first sampling period with a sampling interval of a first time period, generating a received data transition signal from the receiver output such that each transition of a selected direction in a received digital signal is represented by single pulse, enabling a digital phase locked loop simultaneously with the enabled period of the radio receiver so as to potentially acquire bit synchronization with the said received data transition signal, when received, extending the enable time for the radio and digital phase locked loop for a second dime period if the digital phase locked loop becomes locked to the received data transition signal, simultaneously searching for a pre-determined synchronization code word for the duration of the radio enable time, synchronizing digital data codeword timing logic with the receive data transition signal on detection of the synchronization code word, evaluating subsequently repeated occurrences of the synchronization code word only in response to detection of errors in decoding selected digital data codewords, and immediately re-attempting acquisition of bit and batch synchronization on failure to detect the synchronization code word at the expected time.

A Synchronization apparatus for use in a selective call receiver for receiving and demodulating a digital signal of the kind made up of a pre-amble section of alternating 1's and 0's, followed by an indefinite number of batches each comprised of a synchronization code word followed by a pre-determined number of digital data codewords, comprised of a radio receiver means, microcontroller means under software control, and logic means for error detection and decoding the said digital signal digital data from a data stream received by the said receiver means whereby the logic means microcontroller means is enabled to detect the first occurrence of the synchronization code word, and every subsequent occurrence of the synchronization codeword that follows detection of errors in decoding the selected ones of the said digital data codewords.

BRIEF DESCRIPTION OF THE DRAWINGS

These and other features of the invention will become more apparent from the following description in which reference is made to the appended drawings wherein.

DESCRIPTION OF PREFERRED EMBODIMENT

Figure 1:
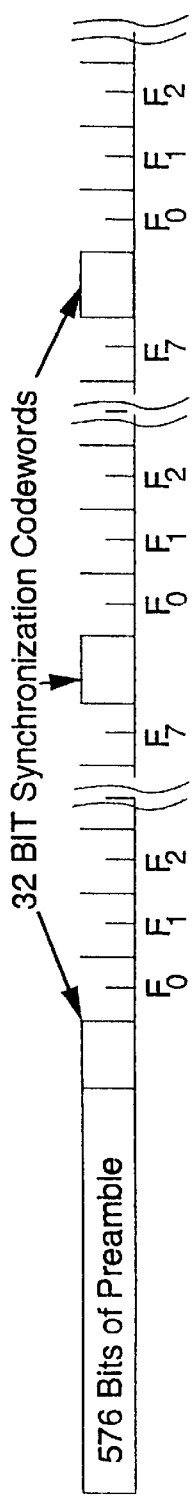
FIG. 1 illustrates the standard base band POCSAG signal structure.
Figure 2:
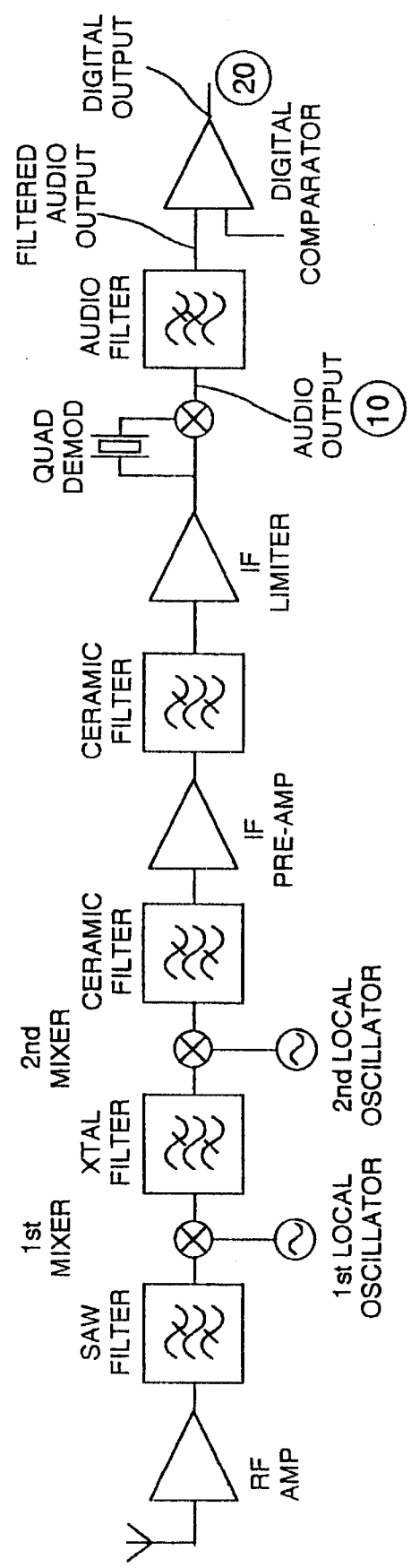
FIG. 2 is a block diagram of a standard, prior art super-heterodyne radio receiver.
Figure 3:
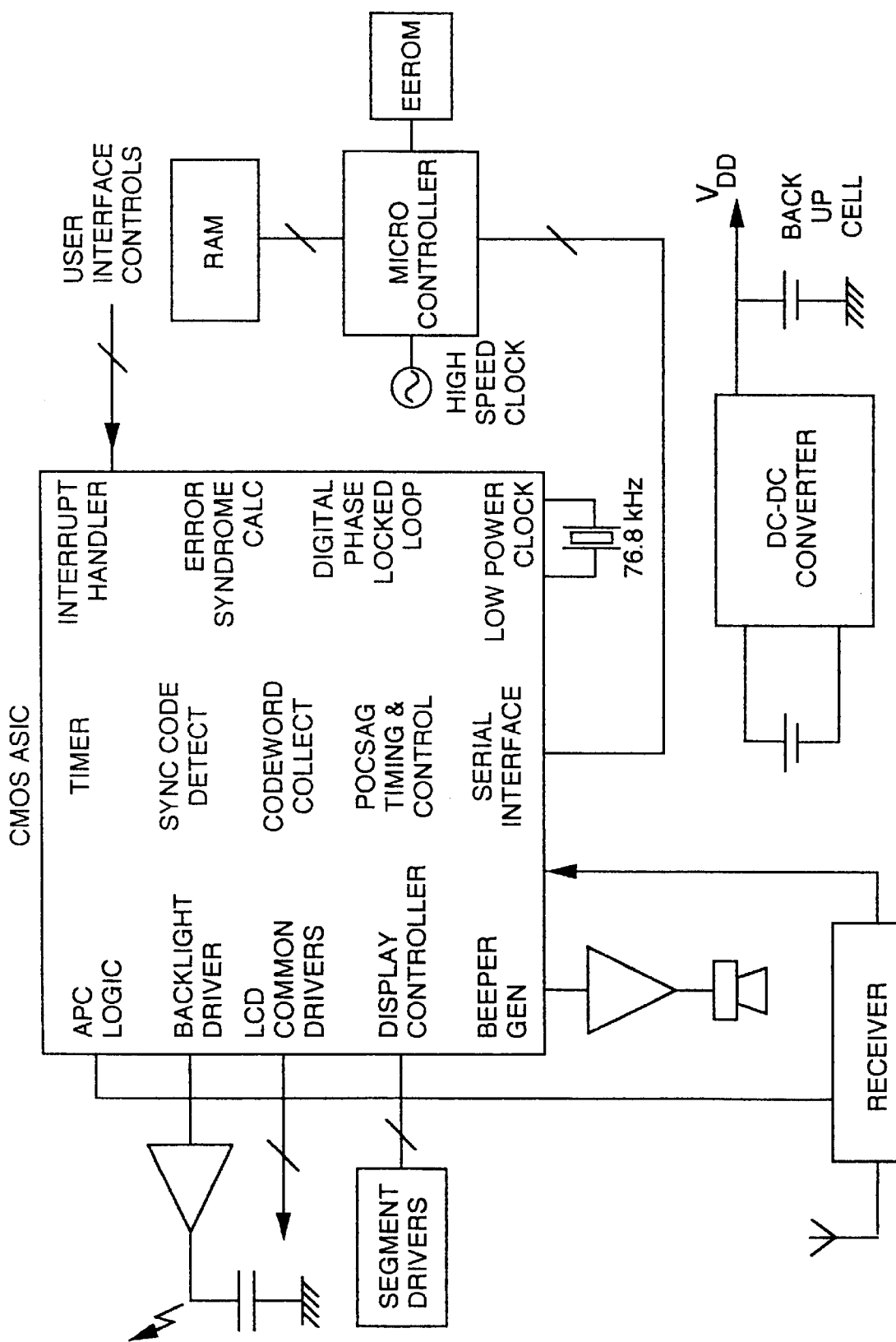
FIG. 3 is a block diagram of a preferred embodiment of the pager of the present invention.

System operation is provided for by a combination of logic circuits implemented as an Application Specific Integrated Circuit (ASIC) and a microcontroller, as shown in FIG. 3. The ASIC contains a digital phase locked loop (DPLL), a codeword collection circuit, an error syndrome calculation circuit, a POCSAG synchronization code word detection circuit, a POCSAG controller, plus a timer and various other dedicated peripheral functions.

In order to decode digital information received by means of the receiver it is necessary for the selective receiver to achieve synchronization with the transmitted data. The DPLL is the means by which the local timing is synchronized with the received data, and synchronization attempts are initiated by the microcontroller under software control.

Figure 4:
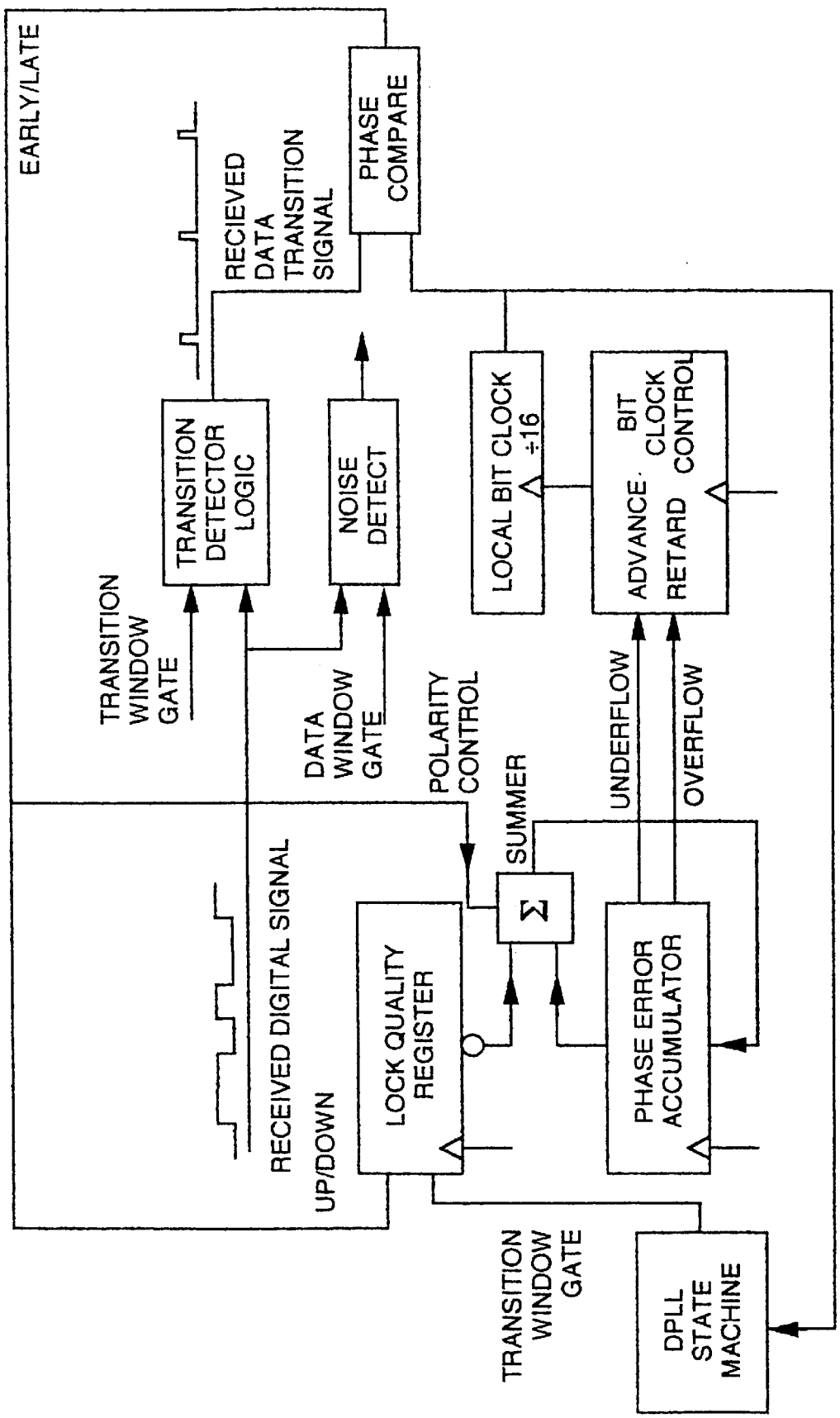
FIG. 4 is a block diagram of the variable bandwidth digital phase locked loop according to the preferred embodiment of the present invention.

The principle elements of the DPLL, as shown in FIG. 4, are: a) Input signal conditioning circuit, b) a state machine to derive the necessary timing and control signals, c) the phase comparator which generates an early/late signal of the received signal compared with the local bit clock, d) a lock quality counter which is initially set to a low value and which increments as the coherence of the local and received clocks is confirmed by repeated evaluation, e) a bit clock phase divider which provides for bit clock phase advance by a injected clock pulse injection or retarded by a clock pulse swallowing of a clock signal which is a multiple of the bit clock, and f) a phase error accumulator.

The operation of the phase loop is described below with reference to FIG. 4. A first input to the DPLL is the received digital signal which is processed to generate a received data transition signal the principle characteristic of which is a single pulse associated with each transition of the chosen polarity. The received data transition signal is then compared with a locally generated bit clock in a phase comparator. The valid compare time is qualified by a transition window gate which is symmetrical in time relative to the locally generated bit clock.

The local bit clock is generated by a 76.8 KHz crystal oscillator the frequency of which is accurate to within 100 ppm of the received data bit clock frequency as implied by the bit timing of the transmitted data. Thus the frequency of the local and received data clocks are essentially the same. The bit clock is obtained from a bit phase divider which is clocked by a signal which is 16 times the frequency of the master clock. The bit phase divider includes circuitry which provides for insertion or deletion of clock pulses to provide for adjustment of the phase of the bit clock divider output.

The objective of the DPLL is to cause the close alignment by feedback of the phase of the local clock signal with that of the bit tinning in the received signal. In the preferred embodiment, the synchronization is selectably with respect to either polarity of the received data transition, to prevent timing distortions caused by asymmetrical transition times. Two other locally generated timing references are the transition window, which as described above is a symmetrical time window about a chosen polarity of the local bit clock transitions, and the data window, which is a time window symmetric with respect to a signal in quadrature with the bit clock, thereby symmetrically including the center of the bit period.

An early/late signal is generated for each received data transition of the chosen polarity, provided that the transition so detected occurs within the transition window, and is also not accompanied by transitions in the data window. The early/late signal is generated as shown in FIG. 4.

The contents of the lock quality register determines the magnitude and direction of phase adjustments that are to be made to the local clock by insertion or deletion of bit clock divider. clock pulse. The lock quality register is set to an initial value of 0, which causes the local bit clock phase to be reset to that of the received signal for selected polarity transition. Subsequently, each transition which occurs within the transition window causes the lock quality to be incremented, provided that the early/late signal state is opposite to the previously determined state. If the lock quality has a value of 1 or 2 an early or late signal causes a phase adjustment of ⅛ of the bit period by insertion or swallowing of 2 bit clock divider clock pulses. For lock quality values of 3 or greater, adjustment to the bit clock divider phase is on overflow or underflow of the phase error accumulator.

In a first embodiment, the contents of the phase error accumulator is the sum of continuous subtraction or addition of its contents with the inverse contents of the quality lock register, with the polarity of summation being determined by the early/late signal. Thus when the lock quality is low, corresponding to the early part of a synchronization process, the incremental changes to the phase accumulator are large. As the lock quality improves, corresponding with the alignment of the local bit clock to the received data transitions, the incremental changes to the phase error accumulator become small. When the phase error accumulator overflows or underflows, the phase of the bit clock is adjusted by the insertion or swallowing of a single clock in the bit clock divider clock sequence, thereby adjusting the output phase by 1/16 of a bit period. At high lock quality, many data transitions are required to cause the phase error accumulator to over or under flow, thus the system becomes relatively immune to noise after achieving bit synchronization.

In a second, preferred embodiment, the phase error accumulator is implemented as a counter, and bit transitions are caused in individual bits, with the binary order of the bit transition being determined by the inverse value of the contents of the lock quality register.

The lock quality is reduced to a preset value at the commencement of every receiving process to allow for the DPLL to track small differences in frequencies which might otherwise cause the phases of the local clock to slip compared with the received signal timing.

The value of the lock quality register is incremented each comparison cycle only if a received data transition occurred within the transition window and no data transitions occurred within the data window and the current early/late determination is opposite compared with the previously determined state. The lock quality register is decremented for each comparison cycle in which a received data transition occurred within the data window.

The DPLL has a capability of accumulating a count of transitions non-coherent with the local bit clock, that occur in the data window, and comparing this count against a pre-set threshold. Under software control, an interrupt can be enabled and generated by such an event. Similarly, the DPLL has capability of detecting a rate of generation of non-coherent data transitions, and with a similar ability to generate an interrupt if the non-coherent edge rate exceeds a preset value.

The DPLL provides a variable bandwidth response, and rapid phase adjustments are made until the lock quality improves, after which the phase adjustments are increasingly fine. Because the phase error accumulator sums the results of many phase comparisons, high phase accuracy can be achieved, even though the adjustment resolution of 1/16 bit period is relatively course. The DPLL bandwidth is effectively controlled by the value contained in the lock quality register which can be set by the microcontroller. By this means the microcontroller can cause re-acquisition of phase lock within a small range, each time the receiver is enabled by resetting the lock quality register to an appropriate value. Since operation of the DPLL is autonomous once it has been enabled, maintenance of bit synchronization can be made continuous, with little overhead required from the microcontroller.

Figure 5:
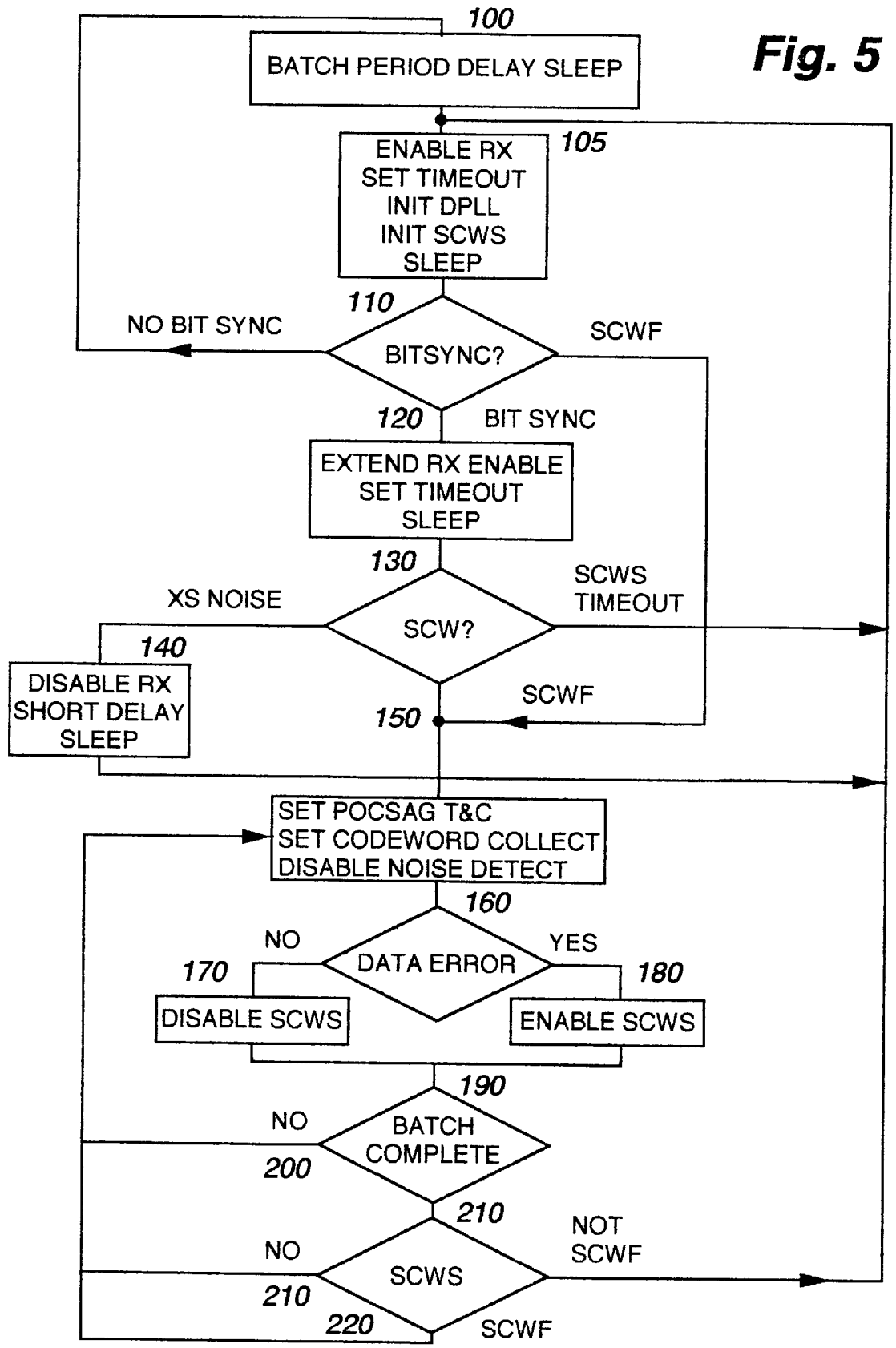
FIG. 5 is a flow diagram of the synchronization algorithm according to the preferred embodiment of the present invention.

The operation of the synchronization algorithm is described below with reference to the flow diagram shown in FIG. 5.

Starting at step 100, the microcontroller sets a timer in the ASIC to a first value, being a wake up delay approximately equal to the batch periodicity, and then executes a STOP instruction which has the effect of stopping all high speed clocks in the microcontroller so the that controller is in a low power "sleep" state. Expiration of the ASIC timer generates an interrupt (105) to the microcontroller which then enables the receiver, presets the wake-up timer with a second maximum bit sync search time, initializes the DPLL, initializes and enables the sync codeword detector, and then sleeps during the bit sync process by the DPLL as indicated by step 110, until interrupted.

If the interrupt was generated by a time-out and the lock quality count in the DPLL registers is below a pre-determined threshold, or by an excess of non correlated transitions over a pre-determined threshold, the microcontroller determines that the bit sync process has failed and the receiver is disabled and flow is returned to step 100. Otherwise, the bit sync process is determined to be successful and the flow continues to step 120. If an interrupt is generated in the course of the bit sync process indicating detection of the sync code word, and on evaluation, the DPLL outputs meet the bit sync criteria, the flow jumps to step 150.

Step 120 corresponds to a successful bit sync process. The microcontroller then extends the receiver enable, sets the wake-up time to a third, maximum sync code search time then returns to the sleep state, while the sync code search circuit evaluates the most 32 most recently received bits for the presence of the sync code word, every bit period. If a match is detected to within two bit errors, an interrupt is generated indicating sync codeword found (step 150).

If the sync codeword search is terminated by a failure of the bit sync circuit to maintain bit synchronization, determined by an excess in the rate of non-coherent data transitions over a pre-determined rate threshold, an interrupt is generated upon which the microcontroller introduces a shorter delay, of the order of half the customary delay of approximately one batch period. The delay is generated by setting the required value in the ASIC timer, after which the microcontroller again sleeps, subsequently passing control to step 105. If the sync codeword search is terminated by a time-out, the microcontroller immediately moves to step 105 which provides for an immediately renewed attempt to achieve synchronization.

In a second embodiment, the evaluation of the sync codeword is performed on 15 bits to within 2 bit errors, being a partial set of the most recently received data bits. If a match is found in the partial set, an interrupt is generated whereafter the microcontroller evaluates the match for the remaining 17 bits, applying the error budget to the entire 32 bit codeword, as required by the protocol. This means of sync codeword detection provides for detection of a second reserved synchronization codeword, which is identical to the first reserved sync codeword with respect to the selected partial codeword, with a minimum of additional logic. The additional overhead to evaluate potential matches of non-matching 32 bit code words is negligible.

In the case that Sync codeword is found, flow passes to step 150. The POCSAG timing and control logic in the ASIC is reset and the microcontroller returns to a sleep state. Thereafter the POCSAG Timing and Control circuit generates the radio control signals which causes the radio receiver to be enabled and 32 bit codewords to be collected for those frames specified by the POCSAG least significant address bits. An interrupt is generated on collection of a codeword which, in response to the interrupt is read by the microcontroller from the ASIC, together with the BCH syndrome which is also computed by the ASIC.

If more than two bits of the syndrome are logic "1" the collected codeword is errored, not correctable and is discarded. On detection of errors, the microcontroller modifies the wake up sequence for the selective receiver to include the next expected synchronization codeword, according to the present timing, else the expected sync codeword slot is disabled. If more codewords have yet to be collected, the ASIC continues with this task in step 160, which is then followed by collection and detection of the sync code word in step 210.

If the sync code search is not successful at the expected time, the selective receiver immediately attempts to re-acquire bit synchronization in step 105. The synchronization code word detection circuit remains active to detect sync code word while the bit synchronization process is underway. If the sync codeword is found control passes to step 150. If the bit sync attempt in step 110 is not successful the flow passes to step 100 and the process repeats.

On detection of a valid address, the microcontroller causes the ASIC to continue to collect message codewords that follow the address until a code word is detected with the message flag set to zero. The microcontroller unpacks the data contained within the message codewords according to the format defined for the selected address and function code, as prescribed by the POCSAG protocol. The message is stored within the memory of the selective receiver, and processed so as to render the message suitable for display, and reception of the message is then enunciated to the user.

The block diagram of the entire receiver is shown in FIG. 3.

The advantages of this synchronization and battery saving algorithm are several fold.

1) The ability of the hardware to simultaneously achieve bit and batch synchronization and the high speed of the variable bandwidth digital phase locked loop eliminates the need of prior art pagers to sequentially undertake these processes, and substantially reduces the time necessary to achieve full synchronization. A concomitant benefit is then a reduction in power consumption because the period during which the radio is enabled is reduced.

2) Because the synchronization code word is evaluated initially to obtain batch synchronization and thereafter intermittently to maintain synchronization, battery power is saved because of the reduced requirement to monitor the synchronization code word transmissions.

3) Immediately re-trying to concurrently bit and batch synchronize to an incoming signal in the event of a failed batch synchronization due to data errors ensures that the synchronization algorithm will correctly respond to concatenated POCSAG batches.

4) A reduced intersample period following a failed batch synchronization process due to a bit synchronization failure resolves the problem of missed pages due to false bit synchronization on leader transmissions or noise.

We claim:

1. A synchronization method in a selective call receiver comprised of a radio receiver, microcontroller, and a digital phase locked loop, whereby synchronization of the local bit clock with a received data stream is achieved by the steps of:
   a) periodically enabling the radio receiver to receive and demodulate a wanted RF signal for a first sampling period with a sampling interval of a first time period
   b) generating a received data transition signal from the receiver output such that each transition of a selected direction in a received digital signal is represented by single pulse
   c) enabling a digital phase locked loop simultaneously with the enabled period of the radio receiver so as to potentially acquire bit synchronization with the said received data transition signal, if received,
   d) extending the enable time for the radio and digital phase locked loop for a second time period if the digital phase locked loop becomes locked to the received data transition signal
   e) simultaneously searching for a pre-determined synchronization code word for the duration of the radio enable time
   f) repeating steps d and e if the digital phase locked loop becomes locked but no sync code word is detected, and
   g) enabling the radio receiver and phase locked loop after a third time period said third time period being shorter than said first time period, if the digital phase locked loop fails to remain locked after having initially becoming locked in any immediately preceding occurrence of step c.

2. A synchronization method in a selective call receiver comprised of a radio receiver, microcontroller, and a digital phase locked loop, whereby synchronization of the local bit clock with a received data stream is achieved by the steps of:

a) periodically enabling the radio receiver to receive and demodulate a wanted RF signal for a first sampling period with a sampling interval of a first time period b) generating a received data transition signal from the receiver output such that each transition of a selected direction in a received digital signal is represented by single pulse c) enabling a digital phase locked loop simultaneously with the enabled period of the radio receiver so as to potentially acquire bit synchronization with the said received data transition signal, when received, d) extending the enable time for the radio and digital phase locked loop for a second time period if the digital phase locked loop becomes locked to the received data transition signal e) simultaneously searching for a pre-determined synchronization code word for the duration of the radio enable time f) synchronizing digital data codeword timing logic with the received data transition signal on detection of the synchronization code word e) evaluating subsequently repeated occurrences of the synchronization code word only in response to detection of errors in decoding selected digital data codewords, and f) immediately re-attempting acquisition of bit and batch synchronization on failure to detect the synchronization code word at the expected time.

3. A synchronization apparatus in a selective call receiver including means for simultaneously detecting a synchronization code word and a variable bandwidth digital phase lock loop, the variable bandwidth digital phase lock loop comprising:

a lock quality register;

a phase error register having overflow and underflow outputs;

a local clock;

means for deriving a clock transition window from the local clock;

a phase detector having inputs for a received data transition signal derived from a received data signal and local clock and an output;

means for generating a binary code from the lock quality register;

means for incrementing or decrementing the lock quality register in dependence upon the output of the phase detector and the clock transition window;

means for summing the binary code into the phase error register wherein the polarity of summing is dependent upon the output of the phase detector; and means responsive to the overflow and underflow output of the phase error register for effecting a phase adjustment of the local clock.

4. A synchronization method in a selective call receiver comprised of a radio receiver, microcontroller, and a digital phase locked loop, whereby synchronization of the local bit clock with a received data stream is achieved by the steps of:

a) periodically enabling the radio receiver to receive and demodulate a wanted RF signal for a first sampling period with a sampling interval of a first time period b) generating a received data transition signal from the receiver output such that each transition of a selected direction in a received digital signal is represented by single pulse c) enabling a digital phase locked loop simultaneously with the enabled period of the radio receiver so as to potentially acquire bit synchronization with the said received data transition signal, if received d) extending the enable time for the radio and digital phase locked loop for a second time period if the digital phase locked loop becomes locked to the received data transition signal e) simultaneously searching for a pre-determined synchronization code word for the duration of the radio enable time f) repeating steps d and e if the digital phase locked loop becomes locked but no sync code word is detected, and g) enabling the radio receiver and phase locked loop after a third time period said third time period being shorter than said first time period, if the digital phase locked loop fails to remain locked after having initially becoming locked in any immediately preceding occurrence of step d.

* * * * *